United States Patent
Ionkin et al.

(10) Patent No.: US 9,076,571 B2
(45) Date of Patent: Jul. 7, 2015

(54) THICK-FILM CONDUCTIVE COMPOSITIONS WITH NANO-SIZED ZINC ADDITIVE

(75) Inventors: Alex Sergey Ionkin, Kennett Square, PA (US); Brian M. Fish, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 527 days.

(21) Appl. No.: 13/395,790

(22) PCT Filed: Sep. 16, 2010

(86) PCT No.: PCT/US2010/049108
§ 371 (c)(1),
(2), (4) Date: Mar. 13, 2012

(87) PCT Pub. No.: WO2011/035015
PCT Pub. Date: Mar. 24, 2011

(65) Prior Publication Data
US 2012/0174978 A1   Jul. 12, 2012

Related U.S. Application Data

(60) Provisional application No. 61/243,192, filed on Sep. 17, 2009.

(51) Int. Cl.
*H01B 1/22* (2006.01)
*C09D 5/24* (2006.01)
*H01L 31/0224* (2006.01)

(52) U.S. Cl.
CPC .. *H01B 1/22* (2013.01); *C09D 5/24* (2013.01); *H01L 31/022425* (2013.01); *Y02E 10/50* (2013.01)

(58) Field of Classification Search
CPC .............. H01B 1/08; H01B 1/16; H01B 1/22; C09D 5/24; H05K 1/092; H05K 1/0296; C03C 4/14; C03C 12/00; C03C 14/006; C03C 2214/00
USPC .......................................... 252/514
See application file for complete search history.

(56) References Cited

U.S. PATENT DOCUMENTS

| | | | |
|---|---|---|---|
| 7,435,361 B2 | 10/2008 | Carroll et al. | |
| 7,485,245 B1 | 2/2009 | Konno | |
| 7,556,748 B2 | 7/2009 | Wang et al. | |
| 8,097,062 B2 * | 1/2012 | Mears | 75/230 |
| 2004/0104262 A1 | 6/2004 | Mears | |
| 2004/0155227 A1 | 8/2004 | Bechtloff et al. | |
| 2008/0223446 A1 | 9/2008 | Wang et al. | |
| 2009/0120483 A1 | 5/2009 | Carroll et al. | |

FOREIGN PATENT DOCUMENTS

| | | | |
|---|---|---|---|
| CN | 1687999 A | | 10/2005 |
| CN | 100485827 C | | 5/2009 |
| JP | 2001-313400 | * | 11/2001 |
| JP | 2001313400 A | | 11/2001 |

* cited by examiner

*Primary Examiner* — Mark Kopec

(57) ABSTRACT

The present invention is a thick film silver composition for use a solar cell device. The thick film paste composition comprises an electrically conductive silver powder, one or more glass frits, a nano-sized additive wherein the nano-sized additive is selected from metallic zinc, zinc alloys or a mixture of metallic zinc and zinc oxide, all dispersed in an organic medium.

3 Claims, 1 Drawing Sheet

THICK-FILM CONDUCTIVE COMPOSITIONS WITH NANO-SIZED ZINC ADDITIVE

FIELD OF THE INVENTION

The present invention is a conductive thick-film silver paste for use on the front side of a solar cell device. The thick film paste composition comprises an electrically conductive silver powder, one or more glass frits, a nano-sized additive wherein the nano-sized additive is selected from metallic zinc, zinc alloys and a mixture of metallic zinc and zinc oxide dispersed in an organic medium.

BACKGROUND OF THE INVENTION

A conventional solar cell structure with a p-type base has a negative electrode that is typically on the front-side or sun side of the cell and a positive electrode on the backside. It is well-known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal contacts that are electrically conductive.

U.S. Pat. No. 7,435,361 to Carroll at al. is directed to a thick film conductive composition useful in a solar cell. The composition has a zinc-containing additive being ZnO, and the composition provides a Pb-free system which maintains electrical performance and solder adhesion.

Although various methods and compositions for forming solar cells exist, there is a need for zinc containing compositions which have improved electrical performance. The present invention fulfills such need.

SUMMARY OF THE INVENTION

An embodiment of the present invention is a thick film paste composition comprising, based on solids:
a) 80 to 99% by weight of an electrically conductive silver powder;
b) 0.1 to 10% by weight of one or more glass frit;
c) 0.1 to 10% by weight of a nano-sized, spherical zinc additive having a specific surface area between 4 $m^2/gr$ to 6 $m^2/gr$, wherein the zinc additive is selected from the group consisting of metallic zinc, zinc alloys and a mixture of metallic zinc and zinc oxide; dispersed in
d) an organic medium.

The present invention is further an article comprising:
(a) one or more substrates;
(b) a deposit of a thick film composition on the one or more substrates, the composition comprising based on solids:
  i) 80 to 99% by weight of an electrically conductive silver powder;
  ii) 0.1 to 10% by weight of one or more glass frit;
  iii) 0.1 to 10% by weight of a nano-sized, spherical zinc additive having a specific surface area between 4 $m^2/gr$ to 6 $m^2/gr$, wherein the zinc additive is selected from the group consisting of metallic zinc, zinc alloys and a mixture of metallic zinc and zinc oxide.

An embodiment of the invention relates to a method of manufacturing a semiconductor device comprising the steps of:

(a) providing one or more semiconductor substrates;
(b) applying an insulating film on the semiconductor substrate;
(c) depositing a thick film paste composition on the insulating film wherein the thick film composition comprises:
  i) 80 to 99% by weight based on solids of an electrically conductive silver powder;
  ii) 0.1 to 10% by weight based on solids of one or more glass frit;
  iii) 0.1 to 10% by weight of a nano-sized, spherical zinc additive having a specific surface area between 4 $m^2/gr$ to 6 $m^2/gr$, wherein the zinc additive is selected from the group consisting of metallic zinc, zinc alloys and a mixture of metallic zinc and zinc oxide; and
(d) firing the semiconductor substrate, insulating film and thick film paste composition, wherein the organic medium is removed, and the silver and glass frit are sintered.

DETAILED DESCRIPTION OF THE INVENTION

Figure 1A:
FIG. 1 is a process flow diagram illustrating the fabrication of a semiconductor device.

An embodiment of the present invention relates to thick film conductor compositions. In an aspect of the embodiment, the thick film conductor compositions may include: a conductive powder, glass frit, and an organic medium. The thick film conductor compositions also include a nano-sized additive. The nano-sized additive is selected from metallic zinc, zinc alloys and a mixture of metallic zinc and zinc oxide. The thick film conductor compositions may include additional components.

An embodiment of the present invention relates to articles, wherein the articles include the thick film conductor compositions. In an aspect, the article may also include one or more insulating films. In an aspect, the article includes a semiconductor substrate. In an aspect, the thick film conductor composition may be formed on the one or more insulating films. In an aspect, the thick film conductor composition may be formed on the semiconductor substrate. In the aspect wherein the thick film conductor composition may be formed on the semiconductor substrate, the structure may not contain an applied insulating film.

In an embodiment, the components of the thick film conductor composition(s) are electrically functional silver powders, nano-sized additive(s), and glass frit dispersed in an organic medium. The components are discussed herein below.

I. Inorganic Components

An embodiment of the present invention relates to thick film conductor compositions. In an aspect of the embodiment, the thick film conductor compositions may include: a silver powder material, glass frit, and an organic medium. The glass frit may be lead-free. The thick film conductor compositions also include an additive. The thick film conductor compositions may include additional components.

A. Electrically Conductive Functional Materials

The electrically conductive material is silver powder. The silver may be in a particle form, a powder form, a flake form, spherical form, provided in a colloidal suspension, a mixture thereof, etc. The silver may be silver metal, alloys of silver, or mixtures thereof, for example. The silver may include silver oxide ($Ag_2O$) or silver salts such as AgCl, $AgNO_3$, AgOOCH$_3$ (silver acetate), AgOOCF$_3$ (silver trifluoroacetate), or silver orthophosphate, $Ag_3PO_4$, or mixtures thereof, for example. Any form of silver compatible with the other thick film components may be used, and will be recognized by one of skill in the art.

The silver may be any of a variety of percentages of the composition of the thick film composition. In a non-limiting embodiment, the silver may be from about 80 to about 99% of the solid components of the thick film composition. In a further embodiment, the silver may be from about 80 to about 85 wt % of the solid components of the thick film composition. In an embodiment, the solids portion of the thick film composition may include about 80 to about 90 wt % silver particles and about 1 to about 9 wt % silver flakes. In an embodiment, the solids portion of the thick film composition may include about 75 to about 90 wt % silver particles and about 1 to about 9 wt % silver flakes, In another embodiment, the solids portion of the thick film composition may include about 75 to about 90 wt % silver flakes and about 1 to about 9 wt % of colloidal silver. In a further embodiment, the solids portion of the thick film composition may include about 60 to about 90 wt % of silver powder or silver flakes and about 0.1 to about 20 wt % of colloidal silver.

In an embodiment, a thick film composition includes a functional phase that imparts appropriate electrically functional properties to the composition. The functional phase may include electrically functional powders dispersed in an organic medium that acts as a carrier for the functional phase that forms the composition. In an embodiment, the composition may be applied to a substrate. In a further embodiment, the composition and substrate may be fired to burn out the organic phase, activate the inorganic binder phase and to impart the electrically functional properties.

In an embodiment, the functional phase of the composition may be coated or uncoated silver particles which are electrically conductive. In an embodiment, the silver particles may be coated. In an embodiment, the silver may be coated with various materials such as phosphorus. In an embodiment, the silver particles may be at least partially coated with a surfactant. The surfactant may be selected from, but is not limited to, stearic acid, palmitic acid, a salt of stearate, a salt of palmitate and mixtures thereof. Other surfactants may be utilized including lauric acid, palmitic acid, oleic acid, stearic acid, capric acid, myristic acid and linolic acid. The counter-ion can be, but is not limited to, hydrogen, ammonium, sodium, potassium and mixtures thereof.

The particle size of the silver is not subject to any particular limitation. In an embodiment, an average particle size is less than 10 microns; in a further embodiment, the average particle size is less than 5 microns.

In an embodiment, silver oxide may be dissolved in the glass during the glass melting/manufacturing process.

B. Zinc Additive(s)

An embodiment of the present invention relates to thick film compositions which contains nano-sized spherical zinc additives. The nano-sized additive is selected from metallic zinc, zinc alloys and a mixture of metallic zinc and zinc oxide. The zinc additive is present in an amount of 0.1 to 10% by weight based on solids of the composition.

In an embodiment, the particle size of the additives is not subject to any particular limitation. In an embodiment, the particle size of the additive may be in the range of 1.0 nanometers (nm) to 125 nm.

Dry nano zinc powder exists as agglomerates. Primary particle size of dry nano-sized metallic zinc powder is between 100 nm and 0.1 microns, preferably between 75 nm and 125 nm. Upon sonification in an organic solvent, the agglomerates are destructed to their primary nanoparticles of about 35 nm.

Morphology of nano-sized metallic zinc should be spherical as determined by Scanning Electron Microscopy (SEM).

Specific surface area of nano-sized metallic zinc is between 4 $m^2/gr$ to 6 $m^2/gr$ as determined by BET value.

Specific gravity of nano-sized metallic zinc is about 7.1 $g/cm^3$. In an embodiment, the additive may contain a mixture of metallic nano-zinc and nano-zinc oxide.

C. Glass Frit

As used herein, "lead-free" means that no lead has been added. In an embodiment, trace amounts of lead may be present in a composition and the composition may still be considered lead-free if no lead was added. In an embodiment, a lead-free composition may contain less than 1000 ppm of lead. In an embodiment, a lead-free composition may contain less than 300 ppm of lead. One of skill in the art will recognize that compositions containing lesser amounts of lead are encompassed by the term lead-free. In an embodiment, a lead-free composition may not only be free of lead, but may also be free of other toxic materials, including Cd, Ni, and carcinogenic toxic materials, for example. In an embodiment, a lead-free composition may contain less than 1000 ppm of lead, less than 1000 ppm of Cd, and less than 1000 ppm of Ni. In an embodiment, the lead-free composition may contain trace amounts of Cd and/or Ni. In an embodiment, no Cd, Ni, or carcinogenic toxic materials are added to a lead-free composition.

In an embodiment of the invention, the thick film composition may include glass materials. In an embodiment, glass materials may include one or more of three groups of constituents: glass formers, intermediate oxides, and modifiers. Exemplary glass formers may have a high bond coordination and smaller ionic size; the glass formers may form bridging covalent bonds when heated and quenched form a melt. Exemplary glass formers include, but are not limited to: $SiO2$, $B2O3$, $P2O5$, $V2O5$, $GeO2$ etc. Exemplary intermediate oxides include, but are not limited to: $TiO2$, $Ta2O5$, $Nb2O5$, $ZrO2$, $CeO2$, $SnO2$, $Al2O3$, $HfO2$ and the like. Intermediate oxides may be used to substitute glass formers, as recognized by one of skill in the art. Exemplary modifiers may have a more ionic nature, and may terminate bonds. The modifiers may affect specific properties; for example, modifiers may result in reduction of glass viscosity and/or modification of glass wetting properties, for example. Exemplary modifiers include, but are not limited to: oxides such as alkali metal oxides, alkaline earth oxides, $PbO$, $CuO$, $CdO$, $ZnO$, $Bi2O3$, $Ag2O$, $MoO3$, $WO3$ and the like.

In an embodiment, the glass materials may be selected by one of skill in the art to assist in the at least partial penetration of oxide or nitride insulating layers. As described herein, this at least partial penetration may lead to the formation of an effective electrical contact to the silicon surface of a photovoltaic device structure. The formulation components are not limited to glass forming materials.

An average particle size of the glass frit (glass composition) in an embodiment of the present invention may be in the range of 0.5-1.5 μm. In a further embodiment, an average particle size may be in the range of 0.8-1.2 μm. In an embodiment, the softening point of the glass frit (Ts: second transition point of DTA) is in the range of 300-600° C. In an embodiment, the amount of glass frit in the total composition may be in the range of 0.1 to 10 wt % based on solids in the composition. In one embodiment, the glass composition is present in the amount of 1 to 5 weight percent based on solids. In a further embodiment, the glass composition is present in the range of 1.5 to 2.5 weight percent based on solids.

The glasses described herein are produced by conventional glass making techniques. The glasses were prepared in 500-

1000 gram quantities. The ingredients may be weighed and mixed in the desired proportions and heated in a bottom-loading furnace to form a melt in platinum alloy crucibles. As is well-known in the art, heating is conducted to a peak temperature (1000° C-1200° C.) and for a time such that the melt becomes entirely liquid and homogeneous. The molten glass is quenched between counter rotating stainless steel rollers to form a 10-20 mil thick platelet of glass. The resulting glass platelet is then milled to form a powder with its 50% volume distribution set between 1-3 microns.

Flux Materials

The flux materials may have properties similar to the glass materials, such as possessing lower softening characteristics. For example, compounds such as oxide or halogen compounds may be used. The compounds may assist penetration of an insulating layer in the structures described herein. Non-limiting examples of such compounds include materials that have been coated or encased in organic or inorganic barrier coating to protect against adverse reactions with organic binder components of the paste medium. Non-limiting examples of such flux materials may include $PbF_2$, $BiF_3$, $V_2O_5$, alkali metal oxides and the like.

Glass Blending

In an embodiment, one or more glass frit materials may be present as an admixture in the thick film composition. In an embodiment, a first glass frit material may be selected by one of skill in the art for its capability to rapidly digest the insulating layer; further the glass frit material may have strong corrosive power and low viscosity.

In an embodiment, the second glass frit material may be designed to slowly blend with the first glass frit material while retarding the chemical activity. A stopping condition may result which may effect the partial removal of the insulating layer but without attacking the underlying emitter diffused region potentially shunting the device is the corrosive action proceeds unchecked. Such a glass frit material may be characterized as having a sufficiently higher viscosity to provide a stable manufacturing window to remove insulating layers without damage to the diffused p-n junction region of the semiconductor substrate.

In a non-limiting exemplary admixture, the first glass frit material may be $SiO_2$ 1.7 wt %, $ZrO_2$ 0.5 wt %, $B_2O_3$ 12 wt %, $Na_2O$ 0.4 wt %, $Li_2O$ 0.8 wt %, and $Bi_2O_3$ 84.6 wt % and the second glass frit material may be as $SiO_2$ 27 wt %, $ZrO_2$ 4.1 wt %, $Bi_2O_3$ 68.9 wt %. The proportions of the blend may be used to adjust the blend ratio to meet optimal performance of the thick film conductor paste, under conditions recognized by one of skill in the art.

Inert Gas Firing

In an embodiment, the processing of photovoltaic device cells utilize nitrogen or other inert gas firing of the prepared cells. The firing temperature profile is typically set so as to enable the burnout of organic binder materials from dried thick film paste or other organic materials present. In an embodiment, the temperature may be between 300-525 degree Celsius. The firing may be conducted in a belt furnace using high transport rates, for example between 40-200 inches per minute. Multiple temperature zones may be used to control the desired thermal profile. The number of zones may vary between 3 to 9 zones, for example. The photovoltaic cells may be fired at set temperatures between 650 and 1000 C, for example. The firing is not limited to this type of firing, and other rapid fire furnace designs known to one of skill in the art are contemplated.

D. Organic Medium

The inorganic components may be mixed with an organic medium by mechanical mixing to form viscous compositions called "pastes", having suitable consistency and rheology for printing. A wide variety of inert viscous materials can be used as organic medium. The organic medium may be one in which the inorganic components are dispersible with an adequate degree of stability. The rheological properties of the medium must be such that they lend good application properties to the composition, including: stable dispersion of solids, appropriate viscosity and thixotropy for screen printing, appropriate wettability of the substrate and the paste solids, a good drying rate, and good firing properties. In an embodiment of the present invention, the organic vehicle used in the thick film composition of the present invention may be a nonaqueous inert liquid. Use can be made of any of various organic vehicles, which may or may not contain thickeners, stabilizers and/or other common additives.

The organic medium may be a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 8 wt. % to 11 wt. % of the total composition. The thick film silver composition of the present invention may be adjusted to a predetermined, screen-printable viscosity with the organic medium.

The ratio of organic medium in the thick film composition to the inorganic components in the dispersion is dependent on the method of applying the paste and the kind of organic medium used, and it can vary.

Usually, the dispersion will contain 70-95 wt % of inorganic components and 5-30 wt % of organic medium (vehicle) in order to obtain good wetting.

Structures

An embodiment of the present invention relates to structure including a thick film composition and a substrate. In an embodiment, the substrate may be one or more insulating films. In an embodiment, the substrate may be a semiconductor substrate. In an embodiment, the structures described herein may be useful in the manufacture of photovoltaic devices. An embodiment of the invention relates to a semiconductor device containing one or more structures described herein; an embodiment of the invention relates to a photovoltaic device containing one or more structures described herein; an embodiment of the invention relates to a solar cell containing one or more structures described herein; an embodiment of the invention relates to a solar panel containing one or more structures described herein.

An embodiment of the present invention relates to an electrode formed from the thick film composition. In an embodiment, the thick film composition has been fired to remove the organic vehicle and sinter the silver and glass particles. An embodiment of the present invention relates to a semiconductor device containing an electrode formed from the thick film composition. In an embodiment, the electrode is a front side electrode.

An embodiment of the present invention relates to structures described herein, wherein the structures also include a back electrode.

An embodiment of the present invention relates to structures, wherein the structures include thick film conductor compositions. In an aspect, the structure also includes one or more insulating films. In an aspect, the structure does not include an insulating film. In an aspect, the structure includes a semiconductor substrate. In an aspect, the thick film conductor composition may be formed on the one or more insulating films. In an aspect, the thick film conductor composition may be formed on the semiconductor substrate. In the aspect wherein the thick film conductor composition may be formed on the semiconductor substrate, the structure may not contain an insulating film.

Thick Film Conductor and Insulating Film Structure:

An aspect of the present invention relates to a structure including a thick film conductor composition and one or more insulating films. The thick film composition may include: (a) an electrically conductive silver powder; (b) one or more glass frits; dispersed in c) an organic medium. The thick film paste composition also includes a nano-sized additive, as described herein. The structure may also include a semiconductor substrate. In an embodiment of the invention, upon firing, the organic vehicle may be removed and the silver and glass frits may be sintered. In a further aspect of this embodiment, upon firing, the conductive silver and frit mixture may penetrate the insulating film.

The thick film conductor composition may penetrate the insulating film upon firing. The penetration may be partial penetration. The penetration of the insulating film by the thick film conductor composition may result in an electrical contact between the conductor of the thick film composition and the semiconductor substrate.

The thick film conductor composition may be printed on the insulating film in a pattern. The printing may result in the formation of busbars with connecting lines, as described herein, for example.

The printing of the thick film may be by plating, extrusion, inkjet, shaped or multiple printing, or ribbons, for example.

A layer of silicon nitride may be present on the insulating film. The silicon nitride may be chemically deposited. The deposition method may be CVD, PCVD, or other methods known to one of skill in the art.

Insulating Films

In an embodiment of the invention, the insulating film may include one or more component selected from: titanium oxide, silicon nitride, SiNx:H, silicon oxide, and silicon oxide/titanium oxide. In an embodiment of the invention, the insulating film may be an anti-reflection coating (ARC). In an embodiment of the invention, the insulating film may be applied; the insulating film may be applied to a semiconductor substrate. In an embodiment of the invention, the insulting film may be naturally forming, such as in the case of silicon oxide. In an embodiment, the structure may not include an insulating film that has been applied, but may contain a naturally forming substance, such as silicon oxide, which may function as an insulating film.

Thick Film Conductor and Semiconductor Substrate Structure:

An aspect of the present invention relates to a structure including a thick film conductor composition and a semiconductor substrate. In an embodiment, the structure may not include an insulating film. In an embodiment, the structure may not include an insulating film which has been applied to the semiconductor substrate. In an embodiment, the surface of the semiconductor substrate may include a naturally occurring substance, such as $SiO_2$. In an aspect of this embodiment, the naturally occurring substance, such as $SiO_2$, may have insulating properties.

The thick film conductor composition may be printed on the semiconductor substrate in a pattern. The printing may result in the formation of busbars with connecting lines, as described herein, for example. An electrical contact may be formed between the conductor of the thick film composition and the semiconductor substrate.

A layer of silicon nitride may be present on the semiconductor substrate. The silicon nitride may be chemically deposited. The deposition method may be CVD, PCVD, or other methods known to one of skill in the art.

Structure in Which the Silicon Nitride may be Chemically Treated

An embodiment of the invention relates to a structure in which the silicon nitride of the insulating layer may be treated resulting in the removal of at least a portion of the silicon nitride. The treatment may be a chemical treatment. The removal of at least a portion of the silicon nitride may result in an improved electrical contact between the conductor of the thick film composition and the semiconductor substrate. The structure may have improved efficiency.

In an aspect of this embodiment, the silicon nitride of the insulating film may be part of the anti-reflective coating (ARC). The silicon nitride may be naturally forming, or chemically deposited, for example. The chemical deposition may be by CVD or PCVD, for example.

Description of Method of Manufacturing a Semiconductor Device

An embodiment of the invention relates to a method of manufacturing a semiconductor device. An aspect of this embodiment includes the steps of:
(a) providing one or more semiconductor substrates
(b) applying an insulating film on the semiconductor substrate,
(c) applying a thick film paste composition comprising:
    i) 80 to 99% by weight based on solids of an electrically conductive silver powder;
    ii) 0.1 to 10% by weight based on solids of one or more glass frits;
    iii) 0.1 to 10% by weight based on solids of a nano-sized additive, wherein the nano-sized additive is selected from metallic zinc, zinc alloys and a mixture of metallic zinc and zinc oxide; dispersed in
    iv) an organic medium on the insulating film, and
(d) firing the semiconductor substrate, insulating film and thick film paste composition,
wherein, upon firing, the organic medium is removed, and the silver and glass frits are sintered.

In an aspect of this embodiment, the glass frits may be lead-free. In an aspect of this embodiment, the one or more insulating films may be selected from the group including: silicon nitride film, titanium oxide film, SiNx:H film, silicon oxide film and a silicon oxide/titanium oxide film.

An embodiment of the invention relates to semiconductor device formed by a method described herein. An embodiment of the invention relates to a solar cell including a semiconductor device formed by a method described herein. An embodiment of the invention relates to a solar cell including an electrode, which includes a silver powder and one or more glass frits, wherein the glass frits are lead-free.

An embodiment of the present invention provides a novel composition(s) that may be utilized in the manufacture of a semiconductor device. The semiconductor device may be manufactured by the following method from a structural element composed of a junction-bearing semiconductor substrate and a silicon nitride insulating film formed on a main surface thereof. The method of manufacture of a semiconductor device includes the steps of applying (for example, coating and printing) onto the insulating film, in a predetermined shape and at a predetermined position, the conductive thick film composition of the present invention having the ability to penetrate the insulating film, then firing so that the conductive thick film composition melts and passes through the insulating film, effecting electrical contact with the silicon substrate. In an embodiment, the electrically conductive thick film composition may be a thick-film paste composition, as described herein, which is made of a silver powder, a nano-sized additive, a glass or glass powder mixture having a softening point of 300 to 600° C., dispersed in an organic vehicle.

In an embodiment, the composition may include a glass powder content of less than 5% by weight of the total composition and a nano-sized additive of no more than 10% by weight of the total composition. An embodiment of the invention also provides a semiconductor device manufactured from the same method.

In an embodiment of the invention, silicon nitride film or silicon oxide film may be used as the insulating film. The silicon nitride film may be formed by a plasma chemical vapor deposition (CVD) or thermal CVD process. In an embodiment, the silicon oxide film may be formed by thermal oxidation, thermal CFD or plasma CFD.

In an embodiment, the method of manufacture of the semiconductor device may also be characterized by manufacturing a semiconductor device from a structural element composed of a junction-bearing semiconductor substrate and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film may beformed by coating a titanium-containing organic liquid material onto the semiconductor substrate and firing, or by a thermal CVD. In an embodiment, the silicon nitride film may be formed by PECVD (plasma enhanced chemical vapor deposition). An embodiment of the invention also provides a semiconductor device manufactured from this same method.

In an embodiment of the invention, the electrode formed from the conductive thick film composition(s) of the present invention may be fired in an atmosphere composed of a mixed gas of oxygen and nitrogen. This firing process removes the organic medium and sinters the glass frit with the Ag powder in the conductive thick film composition. The semiconductor substrate may be single-crystal or multicrystalline silicon, for example.

FIG. 1(a) shows a step in which a substrate is provided, with a textured surface which reduces light reflection. In an embodiment, a semiconductor substrate of single-crystal silicon or of multicrystalline silicon is provided. In the case of solar cells, substrates may be sliced from ingots which have been formed from pulling or casting processes. Substrate surface damage caused by tools such as a wire saw used for slicing and contamination from the wafer slicing step may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This is referred to as the substrate, 10.

Figure 1B:
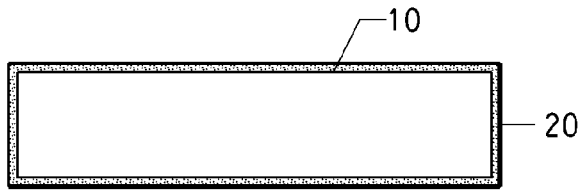
Figure 1C:
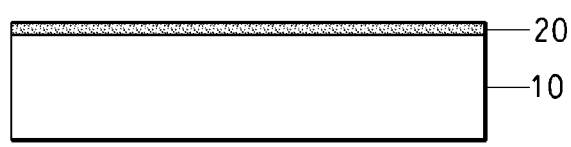

Next, referring to FIG. 1(b), when the substrate 10 used is a p-type substrate, an n-type layer is formed to create a p-n junction. The method used to form such an n-type layer may be phosphorus (P) diffusion using phosphorus oxychloride ($POCl_3$). The depth of the diffusion layer in this case can be varied by controlling the diffusion temperature and time, and is generally formed within a thickness range of about 0.3 to 0.5 μm. The n-type layer formed in this way is represented in the diagram by reference numeral 20. Next, p-n separation on the front and backsides may be carried out by the method described in the background of the invention. Referring to FIG. 1(c) these steps are not always necessary when a phosphorus-containing liquid coating material 20 such as phosphosilicate glass (PSG) is applied onto only one surface of the substrate 10 by a process, such as spin coating, and diffusion is effected by annealing under suitable conditions. Of course, where there is a risk of an n-type layer forming on the backside of the substrate as well, the degree of completeness can be increased by employing the steps detailed in the background of the Invention.

Figure 1D:
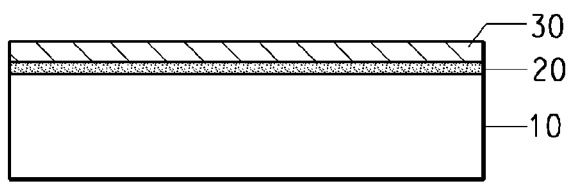

Next, in FIG. 1(d), a silicon nitride film or other insulating films including SiNx:H (i.e., the insulating film comprises hydrogen for passivation during subsequent firing processing) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0. This silicon nitride film may be formed by a process such as low-pressure CVD, plasma CVD, or thermal CVD. When thermal CVD is used, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a compositional ratio between the silicon and the nitrogen of $Si_3N_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of $SiH_4$ and $NH_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by a plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In an alternative embodiment in FIG. 1(d), a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1(d), to form a silicon oxide film on the n-type diffusion layer, 20, instead of the silicon nitride film 30 functioning as an antireflection layer. The silicon oxide film is formed by thermal oxidation, thermal CVD or plasma CVD.

Figure 1E:
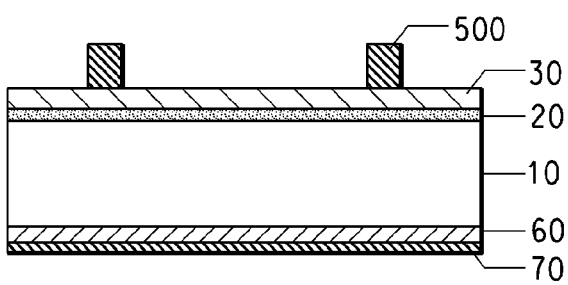

Next, electrodes are formed by steps similar to those shown in FIGS. 1(e) and (f). That is, as shown in FIG. 1(e), aluminum paste, 60, and back side silver paste, 70, are screen printed onto the back side of the substrate, 10, as shown in FIG. 1(e) and successively dried. In addition, a front electrode-forming silver paste 500 is screen printed onto the silicon nitride film, 30, in the same way as on the back side of the substrate, 10, following which drying and firing are carried out in an infrared furnace; the set point temperature range may be 700 to 975° C. for a period of from one minute to more than ten minutes while a mixed gas stream of oxygen and nitrogen are passed through the furnace.

Figure 1F:
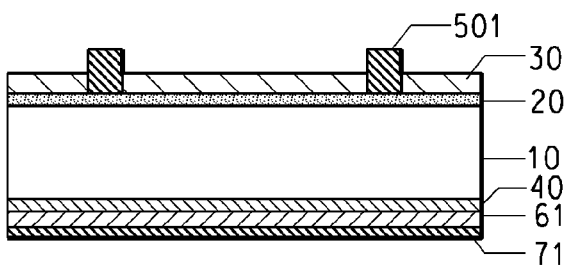

As shown in FIG. 1(f), during firing, aluminum 501 diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. At the same time, because soldering to an aluminum electrode is impossible, the silver or silver/aluminum back electrode is formed on limited areas of the backside as an electrode for interconnecting solar cells by means of copper ribbon or the like.

On the front side, the front electrode silver paste, 500, of the invention is composed of silver, a nano-sized additive, glass frit, organic medium, and is capable of reacting and penetrating through the silicon nitride film, 30, during firing to achieve electrical contact with the n-type layer, 20 (fire through). This fired-through state, i.e., the extent to which the front electrode silver paste melts and passes through the silicon nitride film, 30, depends on the quality and thickness of the silicon nitride film, 30, the composition of the front electrode silver paste, and on the firing conditions. When fired, the paste 500 becomes the electrode 501. The conversion efficiency and moisture resistance reliability of the solar cell clearly depend, to a large degree, on this fired-through state.

EXAMPLES

Materials used in the Examples are described herein. Metallic nano-zinc is commercially available from Aldrich, Strem and Umicore. Nano-sized zinc oxide is available from Strem and Aldrich. 325 Mesh powder of metallic zinc and zinc powder with 6-9 microns were purchased from Alfa Aesar. Copper Zinc alloy (56-60% of copper and 37-41% of zinc) was purchased from Aldrich. Medium 1 contains 11% ethyl cellulose [grade T-200] (Ashland, Covington, Ky.) dispersed in Texanol (Eastman, Kingsport, Tenn.). Medium 2 contains 8% ethyl cellulose [grade n-22] (Ashland, Covington, Ky.) dispersed in Texanol (Eastman, Kingsport, Tenn.).

Paste Preparation

Paste preparations were accomplished with the following procedure: The appropriate amount of solvent, medium and surfactant was weighed then mixed in a mixing can for 15 minutes, then glass frits and nano-sized additives were added and mixed for another 15 minutes. Since Ag is the major part of the solids of the present invention, it was added incrementally to ensure better wetting. When well mixed, the paste was repeatedly passed through a 3-roll mill at progressively increasing pressures from 0 to 400 psi. The gap of the rolls was adjusted to 1 mil. The degree of dispersion was measured by fineness of grind (FOG). The FOG value may be equal to or less than 20/10 for conductors.

The ASF1100 glass frit (available from Asahi Glass Company) used in the following examples was not used as supplied. The frit was milled to a $D_{50}$ in the range of 0.5-0.7 microns prior to use.

Test Procedure-Efficiency

The solar cells built according to the method described herein were placed in a commercial IV tester for measuring efficiencies (ST-1000). The Xe Arc lamp in the IV tester simulated the sunlight with a known intensity and radiated the front surface of the cell. The tester used a four contact method to measure current (I) and voltage (V) at approximately 400 load resistance settings to determine the cell's I-V curve. Both fill factor (FF), series resistance (Ra) and efficiency (Eff) were calculated from the I-V curve.

Paste efficiency and fill factor values were compared to corresponding values obtained with cells contacted with industry standard PV159 (E. I. du Pont de Nemours and Company).

Example 1

Producing a 50 Gram Sample of Paste with 2.5% Nano Zinc

The inorganic components of the paste are mixed together first. First 1.25 g of nano zinc was added to 1.024 g of glass frit. Then 41.53 g of silver were added before this mixture is placed on a jar mill to make a homogenous mixture.

The organics where mixed by the following procedure. To start 0.667 g of medium 1 was added followed by 0.256 g of medium 2. Next 1.025 g of Foralyn by Eastman (Kingsport, Tenn.) was added to the mixture. Then 1.282 g of surfactant Duomeen TDO by Akzo Nobel Surface Company (Chicago, Tenn.) is added to the paste followed by 0.256 g of THIXATROL ST by Elementis (Hightstown, N.J.) as a rheological additive. Finally 1.794 g of DBE-3 by Invista (Wilmington, Del.) was added.

The organics were mixed in a Thinky mixer, by Thinky USA, for thirty seconds. Then the inorganic fraction was added to the organic fraction in 3 equal aliquots with thirty seconds of mixing in the Thinky between each addition. There was 0.85 g of solvent hold-back to adjust the viscosity to the desired level needed for a printing method.

Example 2

Producing a 50 Gram Sample of Paste with 5% Nano Zinc

The inorganic components of the paste are mixed together first. First 2.5 g of nano zinc was added to 1 g of glass frit.

Then 40.5 g of silver were added before this mixture is placed on a jar mill to make a homogenous mixture.

The organics where mixed by the following procedure. To start 0.65 g of medium 1 was added followed by 0.25 g of medium 2. Next 1 g of Foralyn by Eastman (Kingsport, Tenn.) was added to the mixture. Then 1.25 g of surfactant Duomeen TDO by Akzo Nobel Surface Company (Chicago, Tenn.) is added to the paste followed by 0.25 g of THIXATROL ST by Elementis (Hightstown, N.J.) as a rheological additive. Finally 1.75 g of DBE-3 by Invista (Wilmington, Del.) was added.

The organics were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Example 3

Producing a 50 Gram Sample of Paste with 10% Nano Zinc

The inorganic components of the paste are mixed together first. First 5 g of nano zinc was added to 0.949 g of glass frit. Then 38.44 g of silver were added before this mixture is placed on a jar mill to make a homogenous mixture.

The organics where mixed by the following procedure. To start 0.617 g of medium 1 was added followed by 0.237 g of medium 2. Next 0.949 g of Foralyn by Eastman (Kingsport, Tenn.) was added to the mixture. Then 1.186 g of surfactant Duomeen TDO by Akzo Nobel Surface Company (Chicago, Tenn.) is added to the paste followed by 0.237 g of THIXATROL ST by Elementis (Hightstown, N.J.) as a rheological additive. Finally 1.661 g of DBE-3 by Invista (Wilmington, Del.) was added.

The organics were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Example 4

Producing a 50 Gram Sample of Paste with 5% 5-9 µm Zinc

The inorganic components of the paste are mixed together first. First 2.5 g of 5-9µm zinc was added to 1 g of glass frit. Then 40.5 g of silver were added before this mixture is placed on a jar mill to make a homogenous mixture.

The organics where mixed by the following procedure. To start 0.65 g of medium 1 was added followed by 0.25 g of medium 2. Next 1 g of Foralyn by Eastman (Kingsport, Tenn.) was added to the mixture. Then 1.25 g of surfactant Duomeen TDO by Akzo Nobel Surface Company (Chicago, Tenn.) is added to the paste followed by 0.25 g of THIXATROL ST by Elementis (Hightstown, N.J.) as a rheological additive. Finally 1.75 g of DBE-3 by Invista (Wilmington, Del.) was added.

The organics were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Example 5

Producing a 50 Gram Sample of Paste with 5% 325 Mesh Zinc

The inorganic components of the paste are mixed together first. First 2.5 g of 325 mesh zinc was added to 1 g of glass frit. Then 40.5 g of silver were added before this mixture is placed on a jar mill to make a homogenous mixture.

The organics where mixed by the following procedure. To start 0.65 g of medium 1 was added followed by 0.25 g of medium 2. Next 1 g of Foralyn by Eastman (Kingsport, Tenn.) was added to the mixture. Then 1.25 g of surfactant Duomeen TDO by Akzo Nobel Surface Company (Chicago, Tenn.) is added to the paste followed by 0.25 g of THIXATROL ST by Elementis (Hightstown, N.J.) as a rheological additive. Finally 1.75 g of DBE-3 by Invista (Wilmington, Del.) was added.

The organics were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Example 6

Producing a 50 Gram Sample of Paste with 5% CuZn Alloy

The inorganic components of the paste are mixed together first. First 2.5 g of Copper Zinc Alloy nanopowder was added to 1 g of glass frit. Then 40.5 g of silver were added before this mixture is placed on a jar mill to make a homogenous mixture.

The organics where mixed by the following procedure. To start 0.65 g of medium 1 was added followed by 0.25 g of medium 2. Next 1 g of Foralyn by Eastman (Kingsport, Tenn.) was added to the mixture. Then 1.25 g of surfactant Duomeen TDO by Akzo Nobel Surface Company (Chicago, Tenn.) is added to the paste followed by 0.25 g of THIXATROL ST by Elementis (Hightstown, N.J.) as a rheological additive. Finally 1.75 g of DBE-3 by Invista (Wilmington, Del.) was added.

The organics were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Example 7

Producing a 50 Gram Sample of Paste with 5% Zn/ZnO Nanopowders

The inorganic components of the paste are mixed together first. First 0.625 g of nano zinc and 1.875 g nano zinc oxide was added to 1 g of glass frit. Then 40.5 g of silver were added before this mixture is placed on a jar mill to make a homogenous mixture.

The organics where mixed by the following procedure. To start 0.65 g of medium 1 was added followed by 0.25 g of medium 2. Next 1 g of Foralyn by Eastman (Kingsport, Tenn.) was added to the mixture. Then 1.25 g of surfactant Duomeen TDO by Akzo Nobel Surface Company (Chicago, Tenn.) is added to the paste followed by 0.25 g of THIXATROL ST by Elementis (Hightstown, N.J.) as a rheological additive. Finally 1.75 g of DBE-3 by Invista (Wilmington, Del.) was added.

The organic were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Example 8

Producing a 50 Gram Sample of Paste with 10% CuZn Alloy

The inorganic components of the paste are mixed together first. First 5 g of Copper Zinc Alloy nanopowder was added to 0.949 g of glass frit. Then 38.44 g of silver were added before this mixture is placed on a jar mill to make a homogenous mixture.

The organics where mixed by the following procedure. To start 0.617 g of medium 1 was added followed by 0.237 g of medium 2. Next 0.949 g of Foralyn by Eastman (Kingsport, Tenn.) was added to the mixture. Then 1.186 g of surfactant Duomeen TDO by Akzo Nobel Surface Company (Chicago, Tenn.) is added to the paste followed by 0.237 g of THIXATROL ST by Elementis (Hightstown, N.J.) as a rheological additive. Finally 1.661 g of DBE-3 by Invista (Wilmington, Del.) was added.

The organics were mixed in a Thinky mixer, by Thinky USA, for thirty seconds. Then the inorganic fraction was added the organic fraction in 3 equal aliquots with thirty seconds of mixing in the Thinky between each addition. There was 0.85 g of solvent hold-back to adjust the viscosity to the desired level needed for the printing method.

Using 1 inch 200 um wafers from Q-Cells, the effect of the nano-zinc additive was assessed over a range of processing temperatures. Results are shown in Tables 1 through 7.

TABLE 1

Peak Performance of Metallic Zinc Additives

| Additive | Wt % of formulation | FF (%) | Eff (%) | Ra | Example |
|---|---|---|---|---|---|
| Nano Zinc | 2.5 | 75.9 | 15.00 | 0.208 | 1 |
| Nano Zinc | 5 | 78.8 | 15.23 | 0.177 | 2 |
| Nano Zinc Repeat | 5 | 77.7 | 15.23 | 0.179 | 2 |
| Nano Zinc | 7.5 | 77.9 | 14.9 | 0.183 | 3 |
| Zinc 5-9 μm | 5 | 76.2 | 14.37 | 0.215 | 4 |
| Zinc 325 Mesh | 5 | 75.7 | 14.33 | 0.222 | 5 |
| PV159 Control | | 77.6 | 14.91 | 0.183 | |

TABLE 2

Median of Metallic Zinc Additives

| Additive | Wt % of formulation | FF (%) | Eff (%) | Ra | Example |
|---|---|---|---|---|---|
| Nano Zinc | 2.5 | 74.9 | 14.48 | 0.210 | 1 |
| Nano Zinc | 5 | 77.0 | 14.75 | 0.186 | 2 |
| Nano Zinc | 5 | 76.65 | 14.72 | 0.187 | 2 |

TABLE 2-continued

Median of Metallic Zinc Additives

| Additive | Wt % of formulation | FF (%) | Eff (%) | Ra | Example |
|---|---|---|---|---|---|
| Repeat | | | | | |
| Nano Zinc | 7.5 | 77.3 | 14.79 | 0.183 | 3 |
| Zinc 5-9 μm | 5 | 74.1 | 14.04 | 0.244 | 4 |
| Zinc 325 Mesh | 5 | 74.9 | 14.08 | 0.228 | 5 |
| PV159 Control | | 76.5 | 14.72 | 0.190 | |

TABLE 3

Mean of Metallic Zinc Additives

| Additive | Wt % of formulation | FF (%) | Eff (%) | Ra | Example |
|---|---|---|---|---|---|
| Nano Zinc | 2.5 | 74.42 | 14.58 | 0.219 | 1 |
| Nano Zinc | 5 | 76.70 | 14.78 | 0.186 | 2 |
| Nano Zinc Repeat | 5 | 76.38 | 14.78 | 0.188 | 2 |
| Nano Zinc | 7.5 | 77.2 | 14.72 | 0.184 | 3 |
| Zinc 5-9 μm | 5 | 72.32 | 13.69 | 0.244 | 4 |
| Zinc 325 Mesh | 5 | 74.86 | 14.03 | 0.230 | 5 |
| PV159 Control | | 76.34 | 14.65 | 0.188 | |

TABLE 4

Peak Performance of Zinc Alloys and Zinc Mixtures with Zinc Oxide nanopowders

| Additive | Ratio | Wt % of formulation | FF (%) | Eff (%) | Ra | Examples |
|---|---|---|---|---|---|---|
| CuZn Alloy | 3:2 | 5 | 52.4 | 9.53 | 0.545 | 6 |
| Zn/ZnO nanopowders | 1:3 | 5 | 77.4 | 15.26 | 0.182 | 7 |
| PV159 Control | | | 77.2 | 14.91 | 0.184 | |

TABLE 5

Median of Zinc Alloys and Zinc Mixtures with Zinc Oxide nanopowders

| Additive | Ratio | Wt % of formulation | FF (%) | Eff (%) | Ra | Examples |
|---|---|---|---|---|---|---|
| CuZn Alloy | 3:2 | 5 | 49.2 | 8.95 | 0.681 | 6 |
| Zn/ZnO nanopowders | 1:3 | 5 | 75.7 | 14.65 | 0.190 | 7 |
| PV159 Control | | | 76.0 | 14.69 | 0.192 | |

TABLE 6

Mean of Zinc Alloys and Zinc Mixtures with Zinc Oxide nanopowders

| Additive | Ratio | Wt % of formulation | FF (%) | Eff (%) | Ra | Examples |
|---|---|---|---|---|---|---|
| CuZn Alloy | 3:2 | 5 | 48.68 | 8.89 | 0.667 | 6 |
| Zn/ZnO nanopowders | 1:3 | 5 | 75.9 | 14.64 | 0.192 | 7 |
| PV159 Control | | | 75.84 | 14.50 | 0.191 | |

TABLE 7

Alternative Oven Used to fire these Zinc Alloys nanopowders

| Additive | Ratio | Wt % of formulation | FF (%) | Eff (%) | Ra | Examples |
|---|---|---|---|---|---|---|
| CuZn Alloy Peak | 3:2 | 10 | 76.4 | 13.22 | 0.218 | 8 |
| CuZn Alloy Median | 3:2 | 10 | 73.9 | 14.13 | 0.248 | 8 |
| CuZn Alloy Mean | 3:2 | 10 | 73.14 | 13.86 | 0.273 | 8 |
| PV159 Control | Peak | | 77.6 | 13.28 | 0.182 | |
| PV159 Control | Median | | 76.2 | 13.88 | 0.191 | |
| PV159 Control | Mean | | 75.88 | 14.06 | 0.197 | |

What is claimed is:

1. A thick film paste composition comprising, based on solids:
   a) 80 to 99% by weight of an electrically conductive silver powder;
   b) 0.1 to 10% by weight of one or more glass frit;
   c) 0.1 to 10% by weight of a nano-sized, spherical zinc additive having a specific surface area between 4 $m^2$/gr to 6 $m^2$/gr and a particle size of 1.0 to 125 nm, wherein the zinc additive is a mixture of metallic zinc and zinc oxide; dispersed in
   d) an organic medium.

2. The composition of claim 1, wherein the glass frit comprises $Bi_2O_3$ or $B_2O_3$.

3. The composition of claim 1, wherein the glass frit comprises one or more components selected from the group consisting of $SiO_2$, $P_2O_5$, $GeO_2$, and $V_2O_5$.

* * * * *